(12) United States Patent
Chudy et al.

(10) Patent No.: US 7,502,246 B1
(45) Date of Patent: Mar. 10, 2009

(54) STRUCTURE FOR BALLISTIC TRANSISTOR MEMORY CELL

(75) Inventors: David Daniel Chudy, Raleigh, NC (US); Michael G. Lisanke, Durham, NC (US); Cristian Medina, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/170,135

(22) Filed: Jul. 9, 2008

(51) Int. Cl.
*G11C 11/30* (2006.01)

(52) U.S. Cl. ............... 365/129; 313/391; 315/13.11; 365/118; 365/128; 365/217; 365/237

(58) Field of Classification Search ............ 313/391; 315/13.11; 365/118, 128, 129, 217, 237
See application file for complete search history.

(56) References Cited

U.S. PATENT DOCUMENTS

| | | | | |
|---|---|---|---|---|
| 3,760,384 A | | 9/1973 | Krowlikowski et al. | |
| 4,090,253 A | * | 5/1978 | Salgo | 365/128 |
| 5,576,986 A | * | 11/1996 | Matsuzaki et al. | 365/129 |
| 5,917,747 A | * | 6/1999 | Koops et al. | 365/149 |
| 6,714,456 B1 | | 3/2004 | Ogura et al. | |
| 2008/0136454 A1 | | 6/2008 | Diduck et al. | |

* cited by examiner

*Primary Examiner*—Richard T. Elms
*Assistant Examiner*—Michael Lulis
(74) *Attorney, Agent, or Firm*—Shimokaji & Associates, PC

(57) ABSTRACT

A ballistic memory cell structure employing ballistic transistor technology for switching between a read state and a store state is disclosed. The memory cell structure includes substrate structures forming a side wall and a main chamber for defining a linear ballistic channel between the two. The main chamber is formed to include a deflection channel with deflective surfaces to deflect an electron emitted from an electron source into the memory cell structure. Deflection controllers are coupled to the substrate structures for generating biasing fields that adjust the trajectory of electrons flowing through the linear ballistic channel and the deflection channel. Logic output terminals are positioned beyond channel exits for registering exiting electrons and determining a read or store state.

1 Claim, 1 Drawing Sheet

STRUCTURE FOR BALLISTIC TRANSISTOR MEMORY CELL

BACKGROUND OF THE INVENTION

The present invention generally relates to high frequency semiconductor devices and more particularly to high speed ballistic memory cells.

It is known in the art to manufacture memory cells including a single gate transistor and a single gate capacitor from semi-conductor materials. Some transistors may be designed to actively control the flow of electrons. It is known to manufacture transistors by forming a sandwich of two materials; the center material is controlled via current/voltage so as to either permit electrons to flow across the sandwich, or to halt their flow across the sandwich. A prior art memory cell may operate in a microprocessor or similar device by registering a "one" as a collection of electrons on a capacitor, and a "zero" when those electrons are removed. Some may consider the time it takes to move the electrons on and off the capacitor (refill time) as a drawback since it may limit the speed of the memory cell.

As can be seen, there is a need for a high frequency memory cell capable of switching between a memory read state and memory store state employing ballistic transistor technology.

SUMMARY OF THE INVENTION

In one aspect of the present invention, a memory cell structure comprises, a substrate side wall including a side wall surface; a substrate main chamber including a main chamber outer wall positioned parallel and spaced from the side wall surface to define a linear ballistic channel therebetween, the linear ballistic channel including a linear ballistic channel entrance aligned with an electron source emitting a flow of electrons into the linear ballistic channel, wherein the substrate main chamber further includes first, second, and third main chamber inner surfaces positioned to define a hollowed area and a substrate island including first, second, third and fourth island outer surfaces disposed centralized within the hollow area and spaced from the main chamber inner surfaces to define a deflection channel circumventing the substrate island and including a deflection channel entrance and a deflection channel exit wherein the deflection channel entrance is defined by a space between two substrate points and accessible from the linear channel, the substrate main chamber further includes first, second, third, and fourth deflective surfaces, the deflective surfaces comprising rounded corners defined where the main chamber inner surfaces and the substrate points intersect at respective ends; a first deflection controller for generating a first electrical field bias on an electron entering the linear ballistic channel, the first deflection controller comprising a pair of positive and negative terminals disposed in opposition to one another and coupled onto the main chamber outer wall and side wall surface and positioned intermediate the deflection channel entrance and the linear ballistic channel entrance; a second deflection controller for generating a second electrical field bias on the electron traveling through the deflection channel comprising a pair of positive and negative terminals disposed in opposition to one another and coupled onto the second main chamber inner surface and the second island outer surface and positioned intermediate the second internally reflective surface and the deflection channel exit, wherein the second set of deflection controllers is configured to apply the second electrical field bias on the electron traveling through the deflection channel to bias a trajectory of the electron to flow either out the deflection channel exit or on toward the third and fourth reflective surfaces wherein the electron is reflected back toward the first reflective surface again; and first and second logic output terminals, wherein the first logic output terminal is positioned for receiving an electron flowing out the linear ballistic channel exit, and the second logic output terminal is positioned for receiving an electron flowing out the deflection channel exit.

These and other features, aspects and advantages of the present invention will become better understood with reference to the following drawings, description and claims.

DETAILED DESCRIPTION OF THE INVENTION

Figures 1, 2:
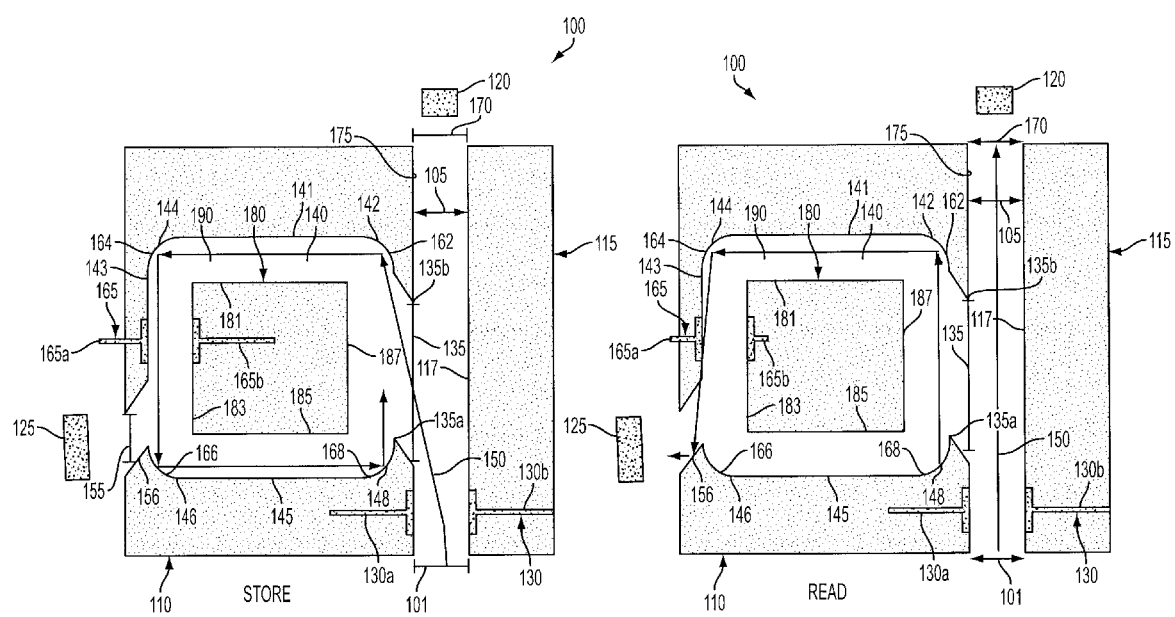
FIG. 1 is a schematic illustrating a memory cell structure in a memory store state according to an exemplary embodiment of the present invention.
FIG. 2 is schematic illustrating a memory cell structure in a memory read state according to the exemplary embodiment shown in FIG. 1.

The following detailed description is of the best currently contemplated modes of carrying out the invention. The description is not to be taken in a limiting sense, but is made merely for the purpose of illustrating the general principles of the invention, since the scope of the invention is best defined by the appended claims.

Referring to FIGS. 1 and 2, an exemplary embodiment of a ballistic transistor memory cell 100 according to the present invention is for receiving particles such as a flow of electrons and directing the electrons into an electron trajectory path 150 dependent on whether the cell may be desired to function in either memory store or read state. The ballistic transistor memory cell 100 may comprise a substrate main chamber 110 which may include a main chamber outer wall 175 and a substrate side wall 115 which may include a side wall surface 117. The substrate main chamber 110 and substrate side wall 115 may each be formed generally rectangular and disposed side by side where the main chamber outer wall 175 and side wall surface 117 may define an elongated linear ballistic channel 105 there between. The linear ballistic channel 105 may include a linear ballistic channel entrance 101 and a linear ballistic channel exit 170.

The substrate main chamber 110 may be formed to include a hollowed area 190 defined by main chamber inner surfaces 141, 143, and 145. A substrate island 180 including first, second, third and fourth island outer surfaces 181, 183, 185, and 187 may be formed square-shaped and disposed centralized within the hollow area 190. The main chamber outer wall 175 may also incorporate an opening defined by substrate points 135a and 135b and positioned intermediately between the linear ballistic channel entrance 101 and the linear ballistic channel exit 170 serving as a deflection channel entrance 135. Additionally, the first island outer surface 181 may cooperate with the first main chamber inner surface 141 to define the first leg of a deflection channel 140 originating from the deflection channel entrance 135. The deflection channel 140 may further be defined by the space between the second island outer surface 183 and the second main chamber inner surface 143, the space between the third island outer surface 185 and the third main chamber inner surface 145, and the space between the fourth island outer surface 187 and the substrate points 135a and 135b. Thus, main chamber inner surfaces and the island outer surfaces may define the deflection channel 140 as a path circumventing the substrate island 180.

Additionally, the main chamber inner surfaces 141, 143, and 145 and the substrate points 135a and 135b may cooperate at respective intersecting ends to form rounded corners 162, 164, 166, and 168. The rounded corner 162 formed where substrate point 135b and inner surface 141 meet may define a first deflection surface 142. The rounded corner 164 formed where inner surfaces 141 and 143 intersect may define a second reflective surface 144. The rounded corner 166 formed where inner surfaces 143 and 145 intersect may define a third reflective surface 146. The rounded corner 168 formed where substrate point 135a and inner surface 145 meet may define a fourth deflection surface 148. It will be understood that the rounded corners 162, 164, 166, and 168 may be of any shape designed such that an electron traveling along the electron trajectory 150 may deflected from one deflective surface toward a next deflective surface by an angle such as 90 degrees.

The ballistic transistor memory cell 100 may also include instrumentalities for directing the electron trajectory 150 of electrons flowing into the cell and detecting an electron's point of exit from the memory cell for determining what state the cell is in. In one exemplary embodiment, a first deflection controller 130 may include positive and negative terminals 130a and 130b which may be coupled in opposing alignment to the main chamber outer wall 175 and side wall surface 117 and positioned intermediate the linear ballistic channel entrance 101 and deflection channel entrance 135. A second deflection controller 165 may include positive and negative terminals 165a and 165b and may be coupled in opposing alignment to the main chamber inner surface 143 and island surface 183. The deflection controller 165 may also be positioned intermediate the second deflection surface 144 and the deflection channel exit 155. Also, the ballistic transistor memory cell 100 may further include a first logic output terminal 120 beyond the linear ballistic channel exit 170 and a second logic output terminal 125 beyond the deflection channel exit 155.

Thus, in operation, either a store memory state or a read memory state may be achieved by manipulating the path of electrons flowing into the ballistic transistor memory cell 100. For example, an electron may flow into the linear ballistic channel 105 through ballistic channel entrance 101 from an electron source (not shown) and may encounter an electrical biasing field generated by the first deflection controller 130. In one exemplary instance, such as during the operation of a store memory state as depicted in FIG. 1, a positive voltage differential may bias the electron attracting it toward the deflection channel entrance 135 into an electron trajectory 150 sending the electron into the deflection channel 140 into confrontation with the first deflection surface 142. The electron may then deflect and continue toward the second deflection surface 144 where it may deflect toward the third deflection surface 146. If the ballistic transistor memory cell 100 is maintained in a store memory state, the electron may pass through the second deflection controller 165 under a neutral biasing field and continue toward the third deflection surface 146 where the electron may then deflect toward the fourth deflection surface 148 and then back on toward the first deflection surface 142 repeating the electron trajectory 150 through the deflection channel 140 until the cell changes state. It should be understood that while the foregoing is described with the second deflection controller 165 operating in a neutral field state, that the second deflections controllers may also generate an electrical biasing field adjusting the electron trajectory back toward a preferred path should the electron deviate from such a path.

In an instance where the ballistic transistor memory cell 100 is switched from a store memory state to a read memory state, such as depicted in FIG. 2, while the electron is traveling through the deflection channel 140, the electron may once again be subjected to an electrical biasing field as it passes between through second deflection controller 165 after deflecting away from the second deflection surface 144. A positive voltage differential in the electrical biasing field may bias the electron's trajectory attracting it toward the deflection channel exit 155 where the electron may encounter the deflection channel exit deflection surface 156 and may leave the deflection channel 140 and ballistic transistor memory cell 100 and thus, may register a signal in the second logic output terminal 125. In another exemplary instance where the ballistic transistor memory cell 100 may be operated in a read memory state as an electron initially enters the linear ballistic channel 105, the first deflection controller 130 may generate a neutral biasing field and the electron trajectory 150 may carry the electron toward the linear ballistic channel exit 170 and out the ballistic transistor memory cell 100 registering a signal in the first logic output terminal 120. It should be understood that while the foregoing is described with the first deflection controller 130 operating in a neutral field state, the first deflection controller may also generate an electrical biasing field adjusting the electron trajectory 150 back toward a preferred path, for example, toward the linear ballistic channel exit 170 should the electron deviate from such a path.

It should be understood, of course, that the foregoing relates to exemplary embodiments of the invention and that modifications may be made without departing from the spirit and scope of the invention as set forth in the following claims.

We claim:
1. A memory cell structure, comprising:
   a substrate side wall including a side wall surface;
   a substrate main chamber including a main chamber outer wall positioned parallel and spaced from the side wall surface to define a linear ballistic channel therebetween, the linear ballistic channel including a linear ballistic channel entrance aligned with an electron source emitting a flow of electrons into the linear ballistic channel, wherein
      the substrate main chamber further includes first, second, and third main chamber inner surfaces positioned to define a hollowed area and a substrate island including first, second, third and fourth island outer surfaces disposed centralized within the hollow area and spaced from the main chamber inner surfaces to define a deflection channel circumventing the substrate island and including a deflection channel entrance and a deflection channel exit wherein the deflection channel entrance is defined by a space between two substrate points and accessible from the linear channel,
      the substrate main chamber further includes first, second, third, and fourth deflective surfaces, the deflective surfaces comprising rounded corners defined where the main chamber inner surfaces and the substrate points intersect at respective ends;
   a first deflection controller for generating a first electrical field bias on an electron entering the linear ballistic channel, the first deflection controller comprising a pair of positive and negative terminals disposed in opposition to one another and coupled onto the main chamber outer wall and side wall surface and positioned intermediate the deflection channel entrance and the linear ballistic channel entrance;

a second deflection controller for generating a second electrical field bias on the electron traveling through the deflection channel comprising a pair of positive and negative terminals disposed in opposition to one another and coupled onto the second main chamber inner surface and the second island outer surface and positioned intermediate the second internally reflective surface and the deflection channel exit, wherein the second set of deflection controllers is configured to apply the second electrical field bias on the electron traveling through the deflection channel to bias a trajectory of the electron to flow either out the deflection channel exit or on toward the third and fourth reflective surfaces wherein the electron is reflected back toward the first reflective surface again; and first and second logic output terminals, wherein the first logic output terminal is positioned for receiving an electron flowing out the linear ballistic channel exit, and the second logic output terminal is positioned for receiving an electron flowing out the deflection channel exit.

* * * * *